United States Patent
Wu et al.

(10) Patent No.: US 9,121,898 B2
(45) Date of Patent: Sep. 1, 2015

(54) RADIATOR MODULE SYSTEM FOR AUTOMATIC TEST EQUIPMENT

(75) Inventors: Xin-Yi Wu, Taoyuan County (TW);
Jui-Che Chou, Taoyuan County (TW);
Meng-Kung Lu, Taoyuan County (TW);
Chin-Yi Ou Yang, Taoyuan County (TW)

(73) Assignee: CHROMA ATE INC., Taoyuan County (TW)

( * ) Notice: Subject to any disclaimer, the term of this patent is extended or adjusted under 35 U.S.C. 154(b) by 482 days.

(21) Appl. No.: 13/415,254

(22) Filed: Mar. 8, 2012

(65) Prior Publication Data

US 2013/0127483 A1 May 23, 2013

(30) Foreign Application Priority Data

Nov. 22, 2011 (TW) ............................ 100142741 A

(51) Int. Cl.
*G01R 31/10* (2006.01)
*G01R 31/28* (2006.01)

(52) U.S. Cl.
CPC ................................. *G01R 31/2877* (2013.01)

(58) Field of Classification Search
CPC ....................... G01R 31/2882–31/2889; G01R 31/2874–31/2879
USPC .......................................... 324/750.01–750.09
See application file for complete search history.

(56) References Cited

U.S. PATENT DOCUMENTS

| | | | | |
|---|---|---|---|---|
| 6,137,298 A * | 10/2000 | Binns | ........................ | 324/750.02 |
| 6,861,861 B2 * | 3/2005 | Song et al. | ............... | 324/750.09 |
| 7,170,276 B2 * | 1/2007 | Park et al. | ................ | 324/750.08 |
| 2004/0189280 A1 * | 9/2004 | Mirkhani et al. | .......... | 324/158.1 |
| 2009/0058439 A1 * | 3/2009 | Suzuki et al. | .................. | 324/754 |
| 2009/0183866 A1 * | 7/2009 | Sakaue et al. | .................. | 165/287 |
| 2010/0224352 A1 * | 9/2010 | Stuckey et al. | ............... | 165/185 |
| 2011/0126931 A1 * | 6/2011 | Ide et al. | .................. | 137/625.47 |
| 2012/0291999 A1 * | 11/2012 | Lewinnek et al. | ........ | 165/104.31 |

FOREIGN PATENT DOCUMENTS

JP  10341090 A  * 12/1998  ............... H05K 7/20

* cited by examiner

*Primary Examiner* — Benjamin M Baldridge
(74) *Attorney, Agent, or Firm* — Locke Lord LLP; Tim Tingkang Xia, Esq.

(57) ABSTRACT

A radiator module system for automatic test equipment, wherein the automatic test equipment comprises at least one test arm, with the front end of the test arm being configured with a test head, and a closed-loop circulating cooling device is installed on the test arm. The closed-loop circulating cooling device includes a conduit which is in contact with the cooling device, internally contains an working fluid and is connected to the test head, a cooling device, a set of fans and a driving source for driving the working fluid. The closed-loop circulating cooling device can operate to circulate and exchange heat energy generated by a device under test (DUT) tightly stressed by downward pressure applied with the test arm, and brings up airflows by means of the fans to perform heat exchange on the cooling device thereby dissipating the generated heat energy.

7 Claims, 12 Drawing Sheets

RADIATOR MODULE SYSTEM FOR AUTOMATIC TEST EQUIPMENT

BACKGROUND OF THE INVENTION

1. Field of the Invention

The present invention relates to a radiator module system for automatic test equipment; in particular, the present invention relates to a radiator module system which can be attached onto the test arm of an automatic test equipment and perform cooling circulations on heat energy generated by a device under test (DUT) tightly stressed by downward pressure applied with the test arm.

2. Description of Related Art

Generally speaking, a test head for device tests can be installed on a robot arm and force a device under test (DUT) tightly stressed by downward pressure into a test area inside an electric or layered test equipment. However, due to certain incapability in the heat sinking mechanism of the conventional test head for high performance integrated circuit (IC) DUT, upon performing electric tests or layered tests, the heat sinking effect of the test head may be insufficient and even reduced after multiple test operations, which may cause adverse influences on the heat dissipation result for heat generated by the IC DUT thus accordingly leading to occurrence of IC device impairment.

In order to resolve the above-said issues, in the industry it is common to prepare an additional cooling machine for connecting to the test head thereby removing the accumulated heat energy from the test head; however, such an additionally added cooling machine takes up significant space and purchase fees for such machines may also undesirably increase the manufacture costs. Besides, the cooling machine needs to connect multiple lines to the test head so as to conduct away the generated heat energy to perform effective heat exchanges. But, unfortunately, in this way the complexity among such pipelines become inevitable, and this complication tends to induce troubles in operation and maintenance processes. Hence, this approach of placing additional cooling machines for heat dissipation will lead to occurrence of many unnecessary problems.

As such, it should be an optimal solution in case that a circulating cooling device can be combined with the test arm having a test head such that it is possible to allow the circulating cooling device to directly perform heat exchanges on heat energy generated by a DUT tightly stressed by downward pressure applied with the test arm so as to dissipate the generated heat energy.

SUMMARY OF THE INVENTION

The present invention is characterized in that a circulating cooling device can be combined with a test arm in order to form a radiator module system; consequently, it is possible to allow the circulating cooling device to directly perform heat exchanges on heat energy generated by a DUT tightly stressed by downward pressure applied with the test arm thereby dissipating the generated heat energy.

A radiator module system for automatic test equipment according to the present invention can achieve the aforementioned objectives, wherein the radiator module system can be used on an automatic test equipment and comprises a closed-loop circulating cooling device and at least one test arm, with the front end of the test arm being configured with a test head, in which the closed-loop circulating cooling device includes a conduit having an outlet and an inlet, a cooling device, a set of fans and a driving source for driving the working fluid. Herein the conduit is installed at the cooling device and internally includes the working fluid, in which the outlet and the inlet can be respectively connected to the test head through the conduit. The closed-loop circulating cooling device can operate to circulate and exchange heat energy generated during tests by a device under test (DUT) tightly stressed by downward pressure applied with the test arm, and brings up airflows by means of the fans to perform heat exchanges on the cooling device thereby dissipating the generated heat energy.

More specifically, the conduit between the aforementioned outlet and inlet is configured with at least a set of heat sinks.

More specifically, the working fluid inside the conduit flows among the test head, the outlet, the inlet and the cooling device.

More specifically, the above-said fans are installed in a parallel direction relative to the cooling device.

More specifically, the above-said test head can be connected to a test jig such that the test head can be applied to various types of DUT.

Furthermore, the automatic test equipment according to the present invention comprises an entry area, used to place a carrier tray having a plurality of devices under test (DUTs); an exit area, used to place a carrier tray having a plurality of tested DUTs; a set of X-Y-axis pick-up arms, used to move the DUT among the carrier tray in the entry area, the carrier tray in the exit area and the test area; a plurality of transport devices; and at least one test arm, in which each of the transport devices is configured with a test socket for insertion of the DUT and repeatedly shuttles within the automatic test equipment. Also, the test arm and the closed-loop circulating cooling device are as previously described, and the closed-loop circulating cooling device is installed onto the test arm.

Therefore, upon transferring the DUT from the carrier tray in the entry area to the test area by the pick-up arm, received by a transport device having a test socket, and then moving the DUT to the test area of a Z-axis test arm by the transport device, the Z-axis test arm descends to cause the test head to tightly stress the DUT for test operations, and the heat generated in testing the DUT is subject to cooling circulations performed by the closed-loop circulating cooling device; afterward, the tested electronic component is taken away from the test area by the transport device and then moved and assorted by the pick-up arm onto the carrier tray in the exit area.

DETAILED DESCRIPTION OF THE PREFERRED EMBODIMENTS

The aforementioned and other technical contents, aspects and effects in relation with the present invention can be clearly appreciated through the detailed descriptions concerning the preferred embodiments of the present invention in conjunction with the appended drawings.

Figure 1A:
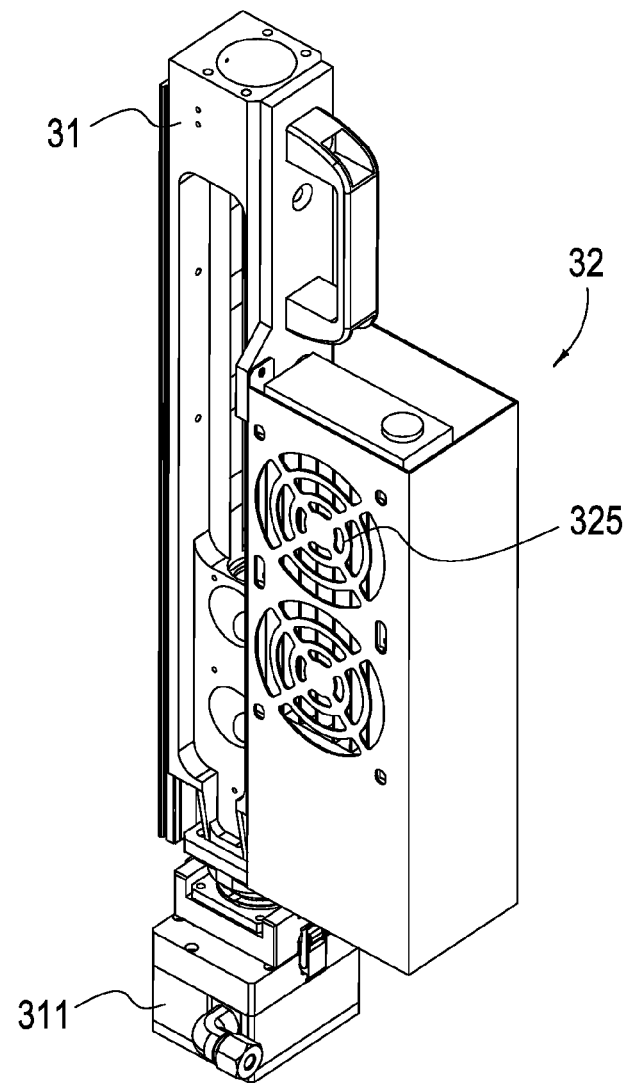
FIG. 1A shows a structure view of a radiator module system for automatic test equipment according to the present invention.
Figure 1B:
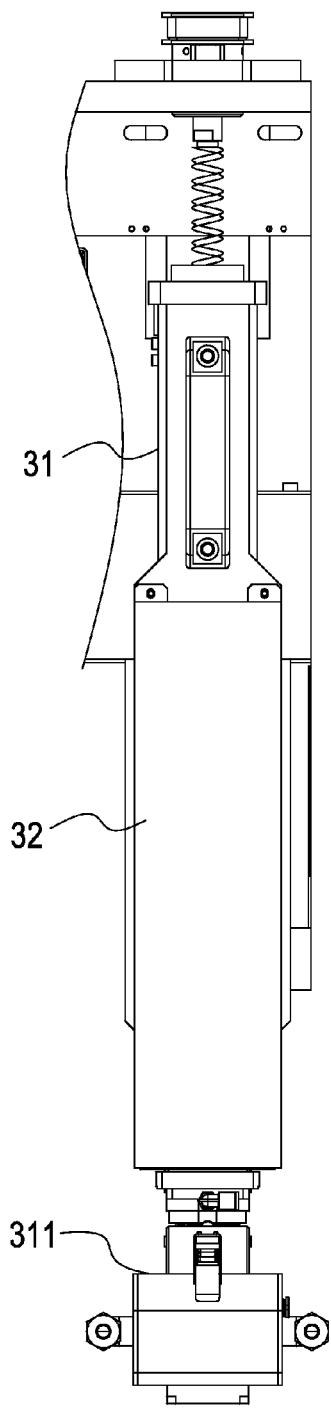
FIG. 1B shows a front view of the radiator module system for automatic test equipment according to the present invention.

Refer now to FIGS. 1A and 1B, wherein a structure view and a front view, respectively, for the radiator module system in an automatic test equipment according to the present invention are shown. The radiator module system comprises a closed-loop circulating cooling device and at least one test arm. As shown, the closed-loop circulating cooling device 32 is installed on the test arm 31, and the closed-loop circulating cooling device 32 as shown in FIG. 2B includes an outlet 321 and an inlet 322, a cooling device 323, a set of fans 324 installed in a direction parallel to the cooling device 323 as well as a driving source 236 for driving the working fluid. The cooling device 323 is further configured with a set of heat sinks 3230 and in contact with the conduit (not shown) within the cooling device 323 for heat dissipation. From FIGS. 1B and 2B, it can be seen that the conduit having the outlet 321 and the inlet 322 as its ends is arranged between the cooling device 323 and the driving source 326 and internally includes the working fluid; in addition, the outlet 321 and the inlet 322 are respectively connected to the test head 311 located at the front end of the test arm 31, e.g., through conduit connections, thereby providing the test head 311 with the heat removing feature. Hence, the working fluid flowing through the inside of the test head 311 enters into the cooling device 323 by way of the inlet 322 for heat removal, the cooling device 323 subsequently causes the heat-dissipated working fluid to flow into the driving source 326 (such as a motor, a pump and the like), and then the working fluid reenters into the test head 311 through the outlet 321, thus repeatedly working in cycle to perform heat sinking or heat exchange processes on the DUT by means of the test head 311. However, those skilled ones in the art can appreciate that the direction of the working fluid can be also reversed with respect to the previous descriptions to achieve the same effect.

As the working fluid enters into the conduit inside the cooling device 323 via the inlet 322, since heat energy generated in tests has been absorbed by the working fluid, the closed-loop circulating cooling device 32 circulates and exchanges heat energy generated during tests by the DUT tightly contacted and stressed by the test head 311; following this, such heat energy can be exchanged and dissipated by the heat sinks 3230 installed on the conduit between the outlet 321 and the inlet 322 and the fans 324 can be activated to create airflows to discharge heat energy.

Figure 2A:
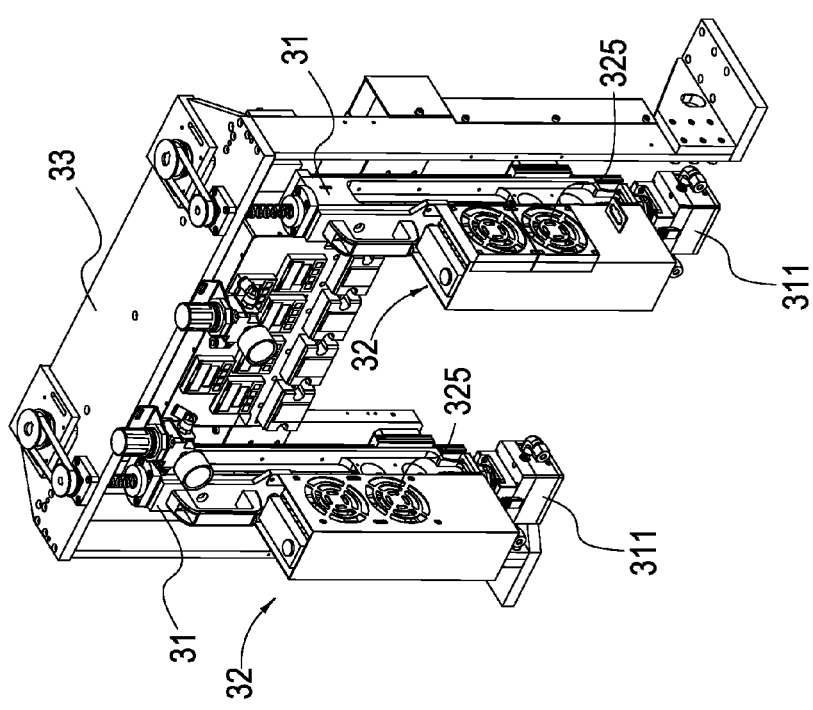
FIG. 2A shows a partial assembly structure view of a radiator module system for automatic test equipment according to the present invention.
Figure 2B:
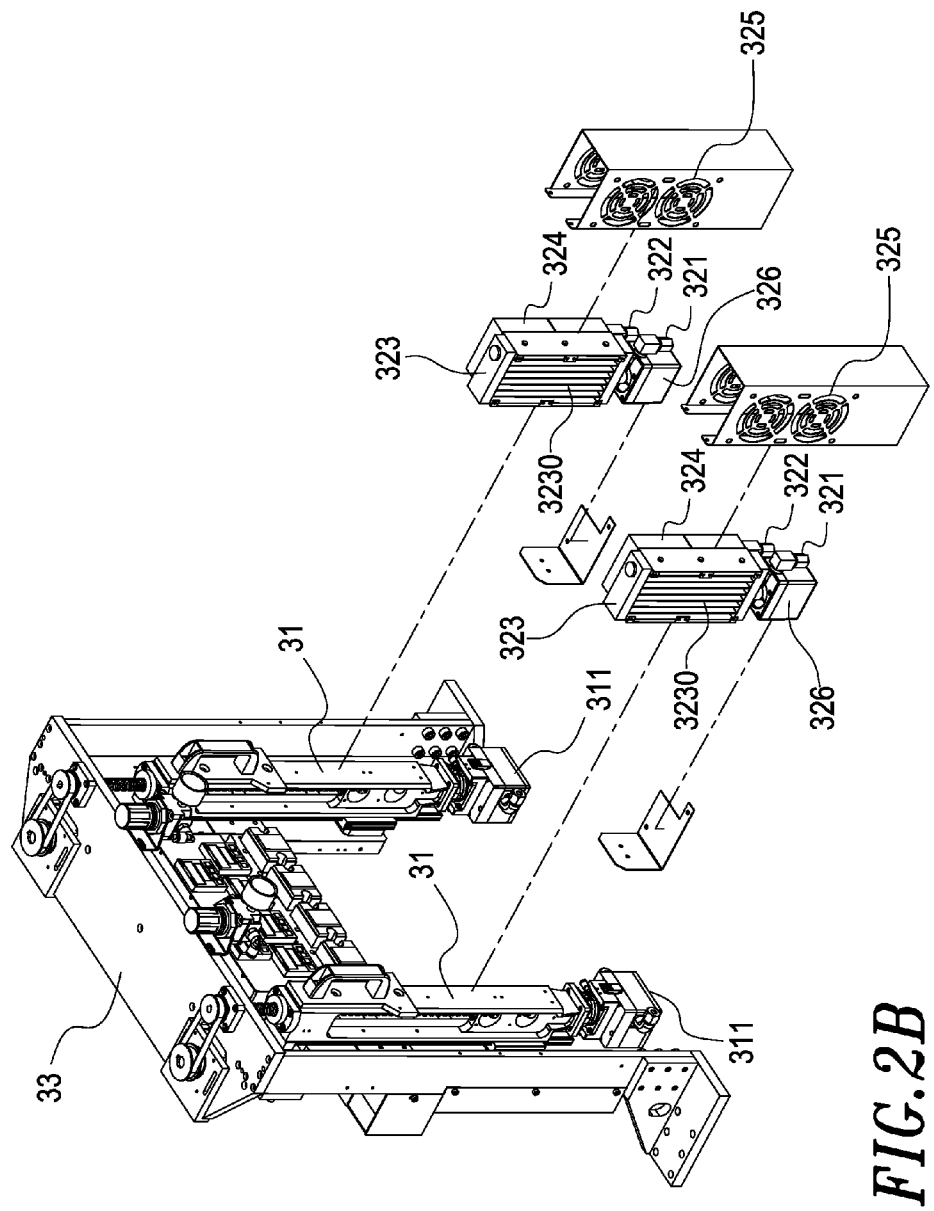
FIG. 2B shows a partial disassembly structure view of a radiator module system for automatic test equipment according to the present invention.

Furthermore, seeing that, in the radiator module system according to the present invention, heat energy generated from the DUT tightly stressed by downward pressure of the test arm 31 can be exchanged through the closed-loop circulating cooling device 32, thus, as shown in FIGS. 2A and 2B, when the outlet 321, the inlet 322, the cooling device 323, the fans 324 and the driving source 326 are installed inside the housing 325, the closed-loop circulating cooling device 32 can be connected to the test arm 31 on the test mechanism 33 and the test arm 31 is allowed to move up/down in a Z-axis direction; consequently, as lowering the test arm 31 to cause the test head 311 to tightly stress the DUT during tests, the closed-loop circulating cooling device 32 can perform circulation exchanges on heat energy generated during tests from the DUT tightly contacted and stressed with the test head 311 of the test arm 31.

Because the present invention is essentially applied to the automatic test equipment, to specifically demonstrate the innovative design with regards to the radiator module system for automatic test equipment according to the present invention, a test operation view is shown as below for illustrations from entry, test to exit phases.

Figure 3A:
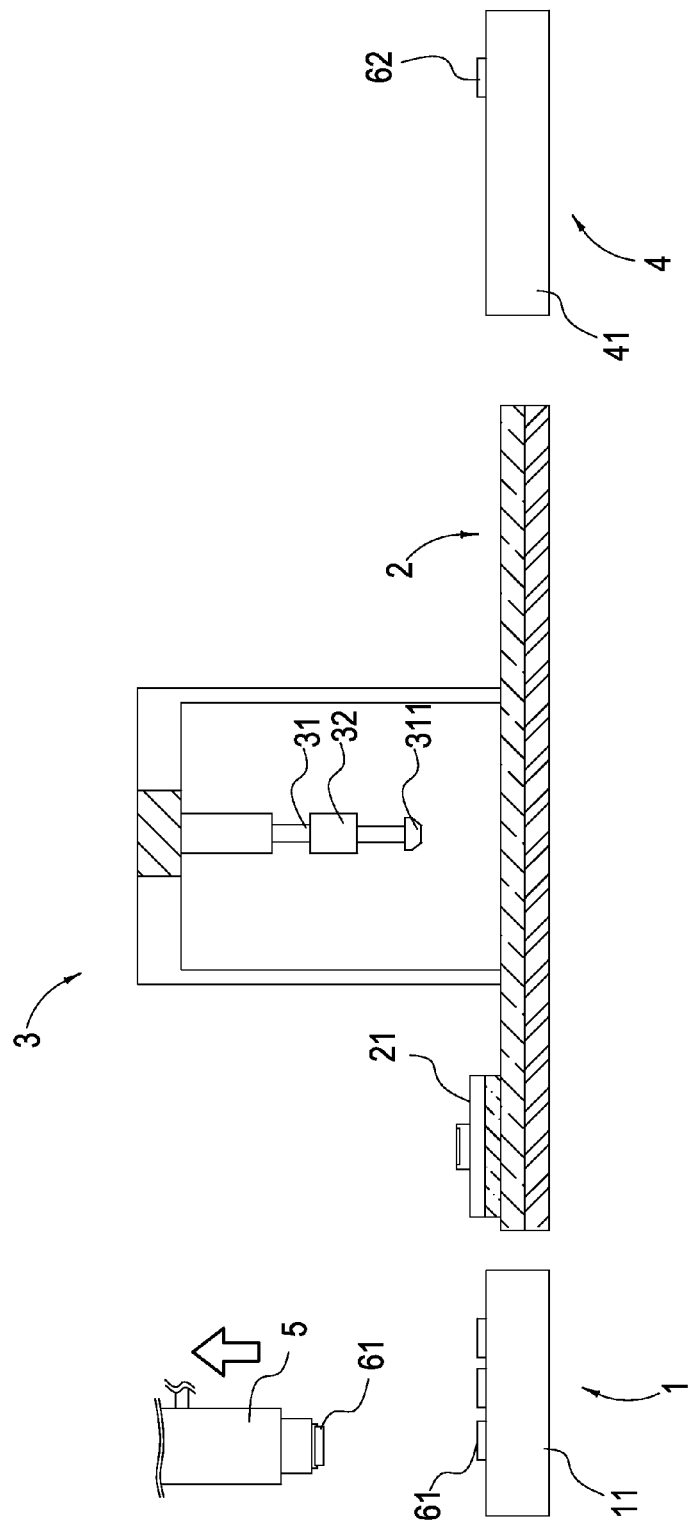
FIGS. 3A to 3H show test operation views of a radiator module system for automatic test equipment according to the present invention.
Figure 3B:
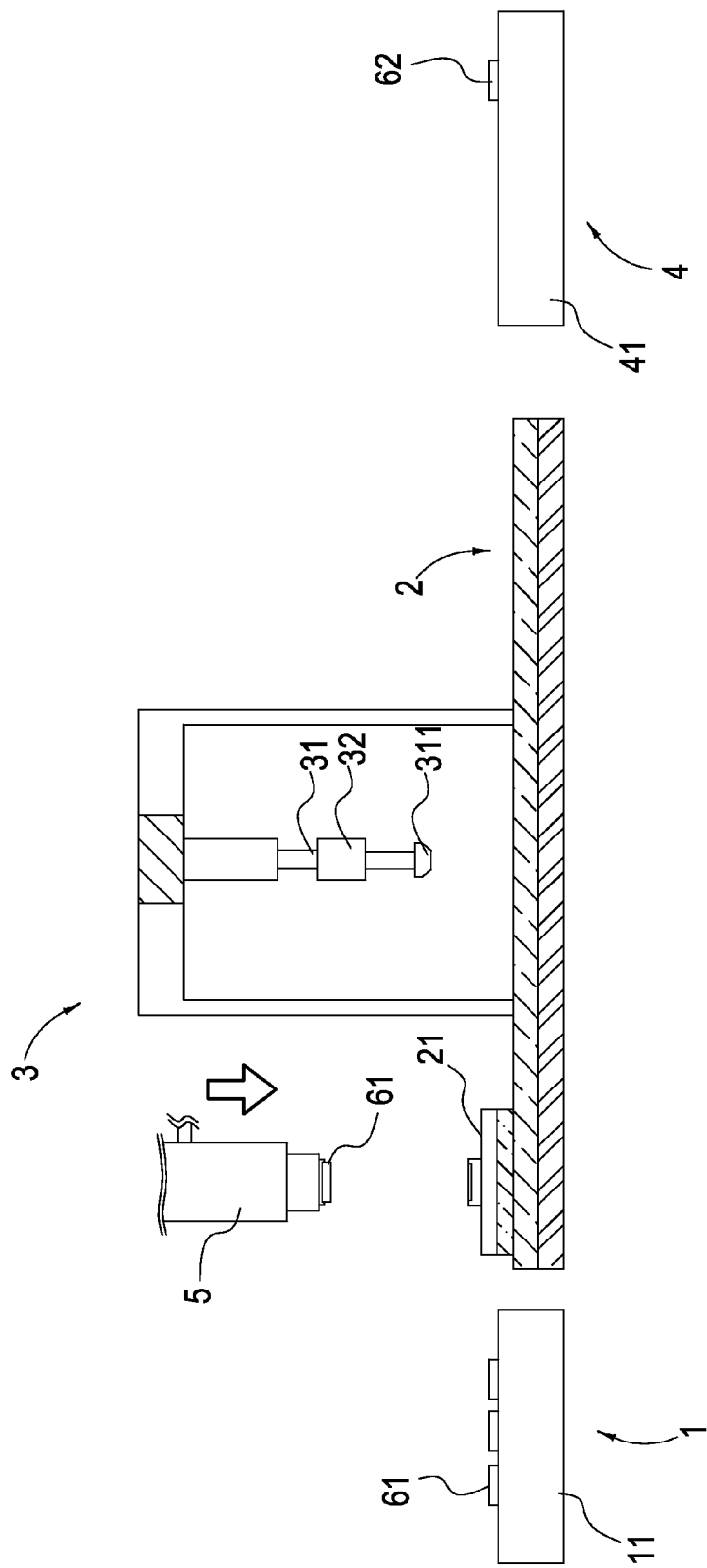
Figure 3C:
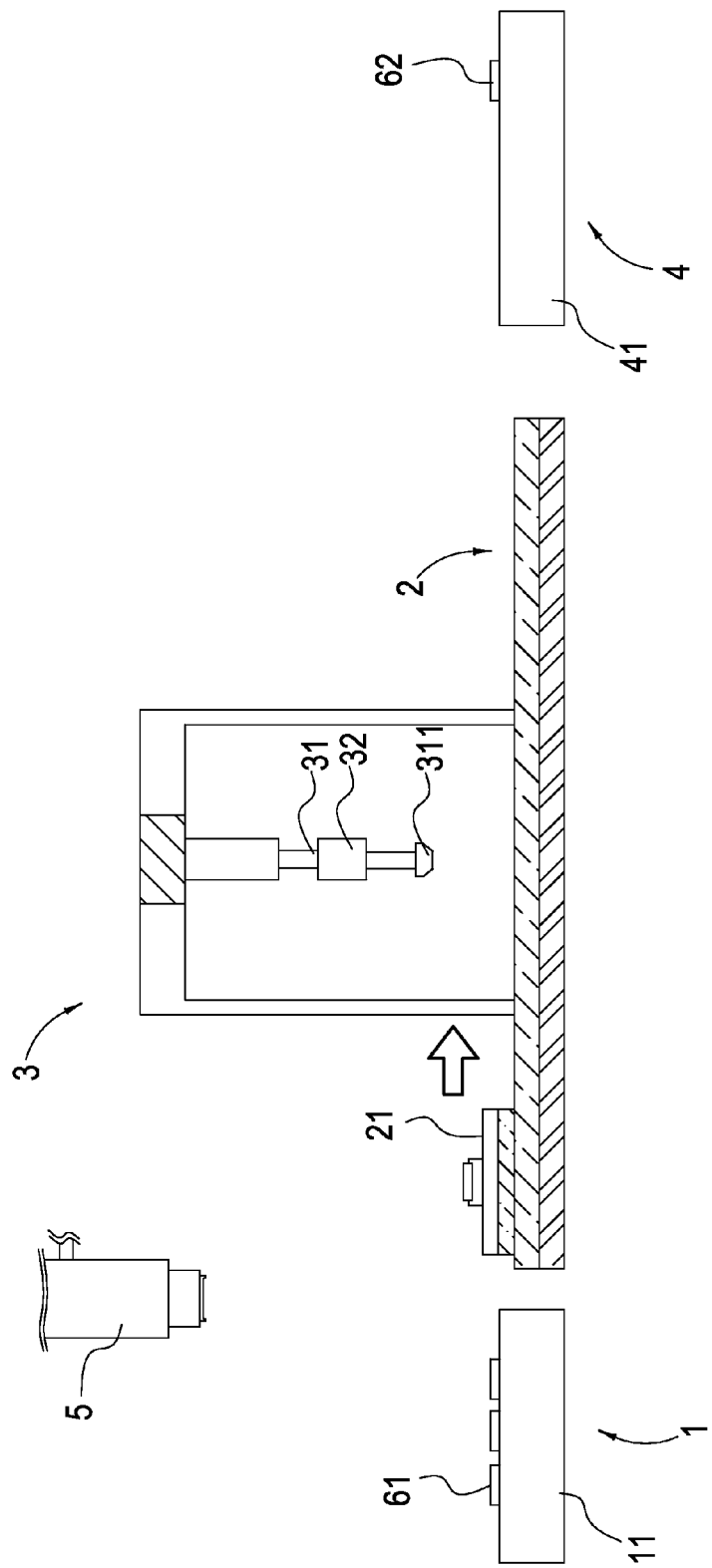
Figure 3D:
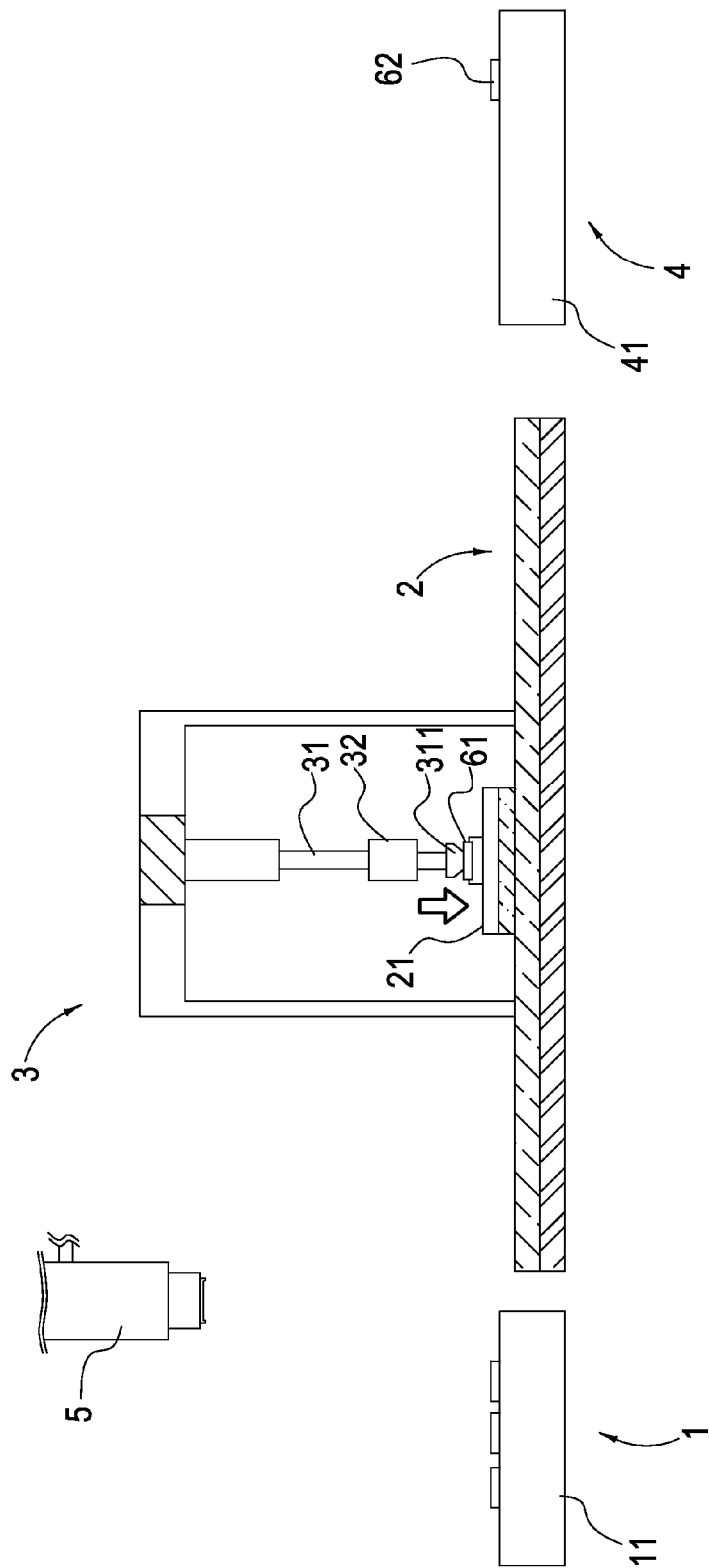

From FIGS. 3A and 3B, it can be observed that the X-Y-axis pick-up arm 5 first moves a DUT 61 from the carrier tray 11 in the entry area 1 to a transport device 2, received by the transport device 2 with a test socket 21, and, as shown in FIG. 2C, the transport device 2 transfers the DUT 61 to the test area 3 equipped with a descending test mechanism and the DUT 61 is subject to test operations; then, as shown in FIG. 3D, the Z-axis test arm 31 lowers to cause the test head 311 to tightly stress the DUT 61 for testing, and at the same time heat energy generated during tests by the DUT 61 can be removed through cooling circulations performed by the closed-loop circulating cooling device 32.

Figure 3E:
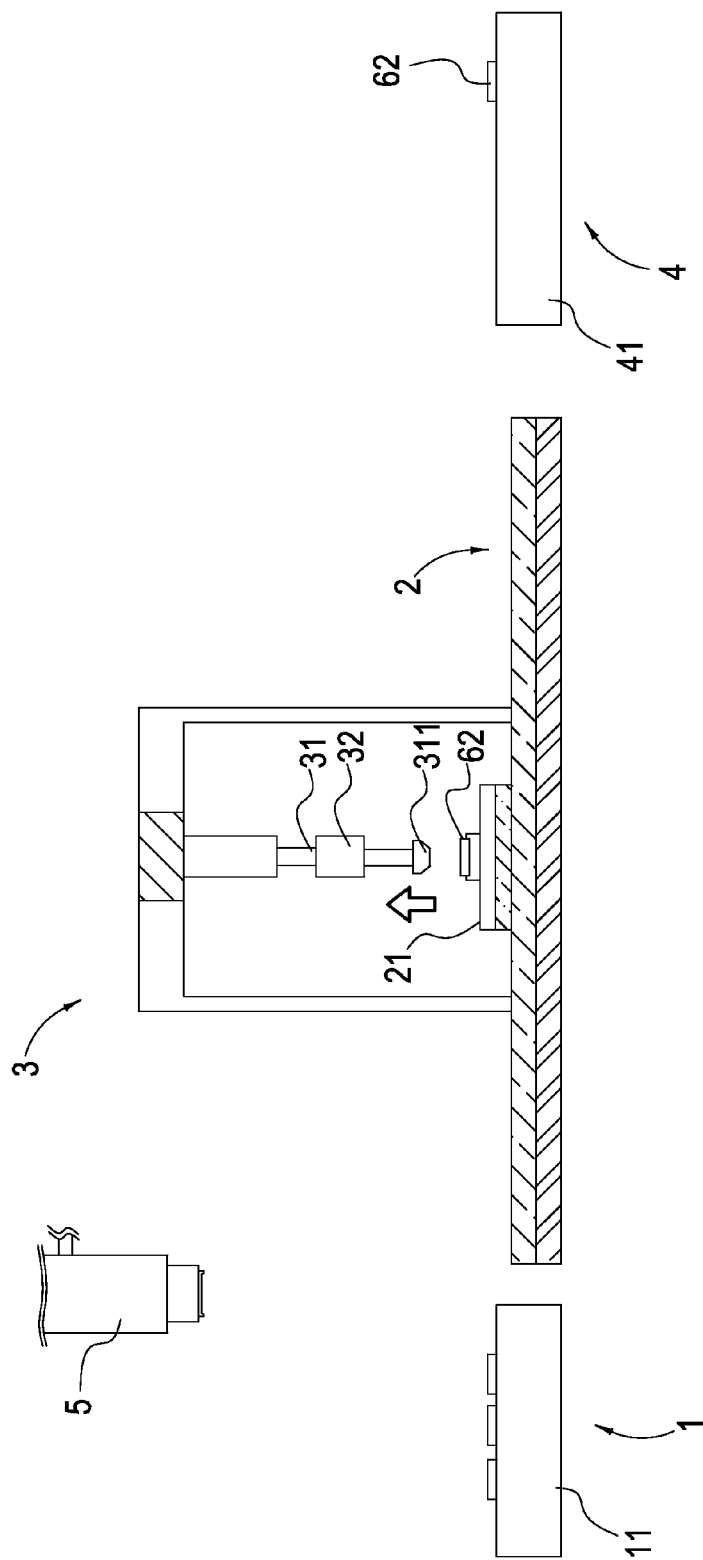
Figure 3F:
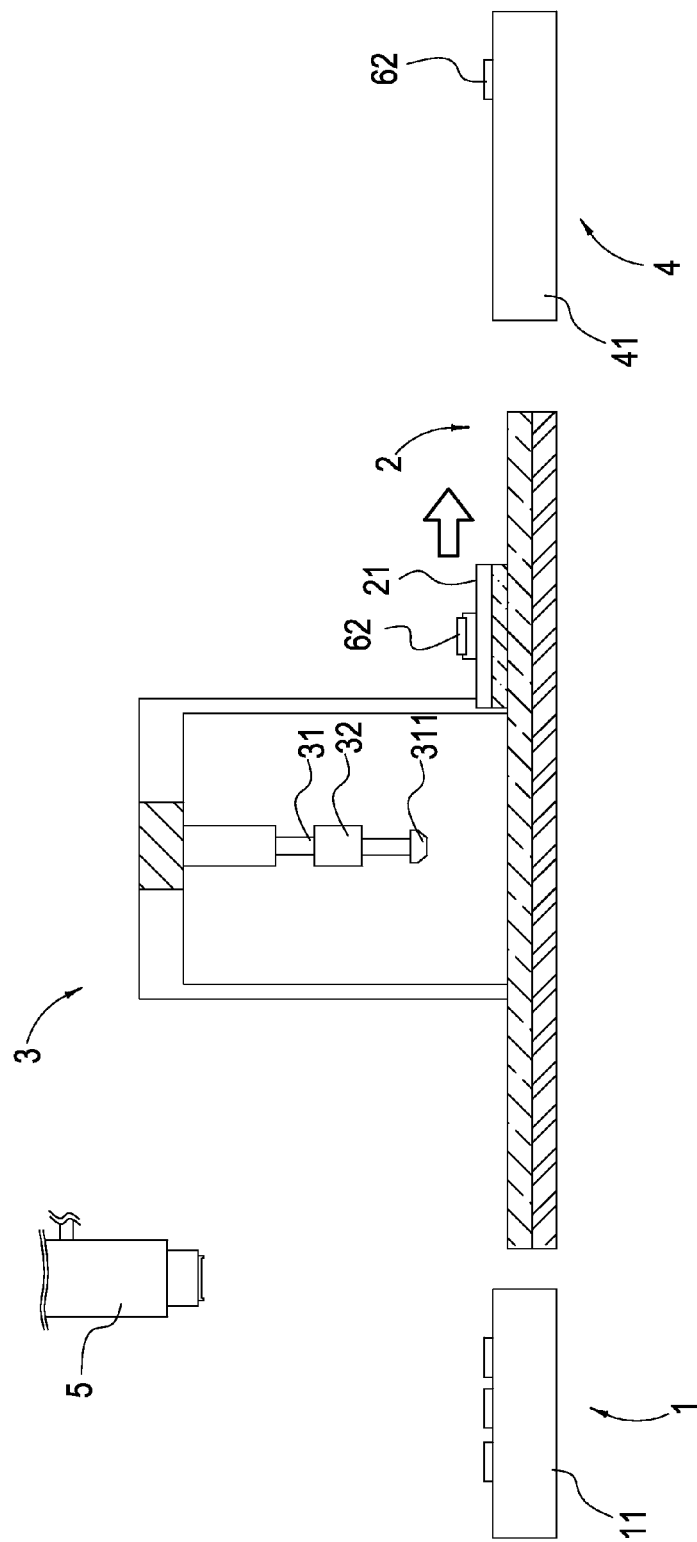
Figure 3G:
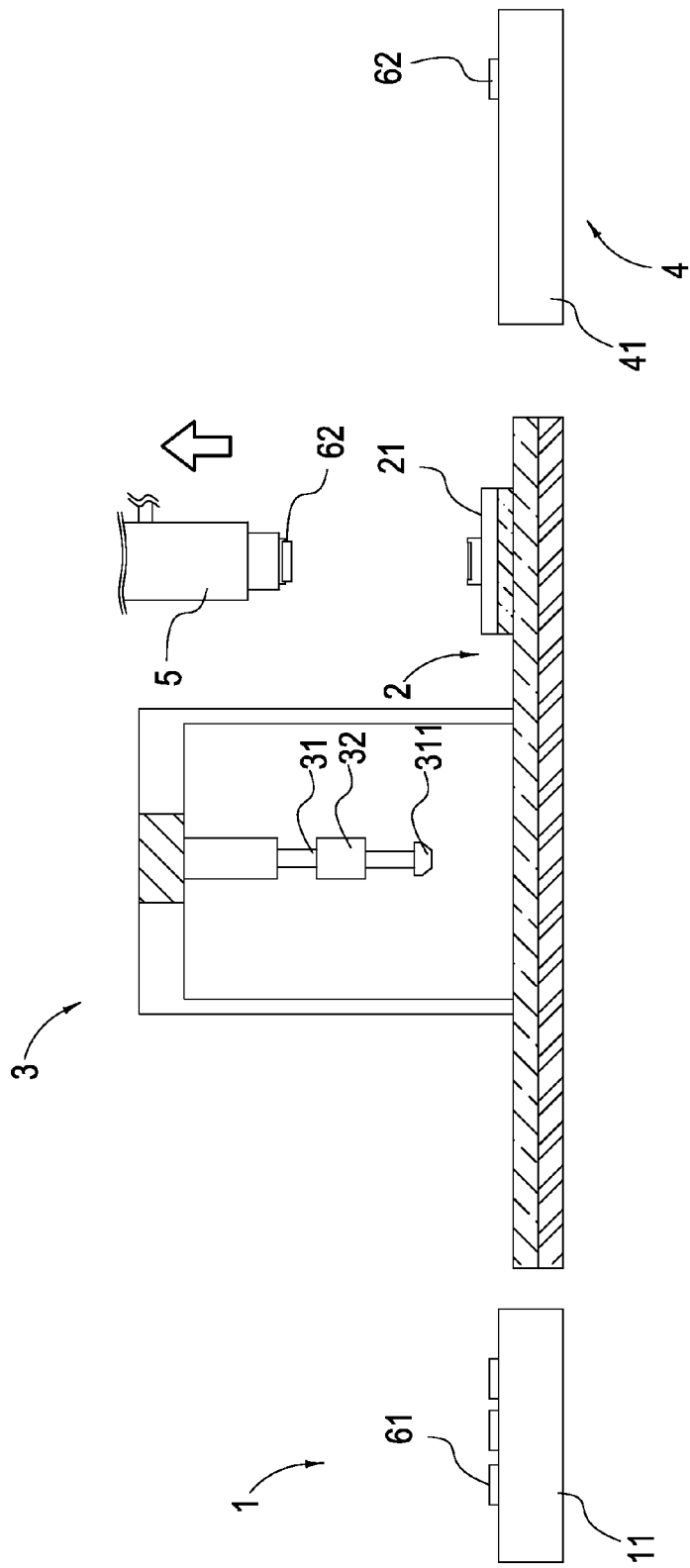
Figure 3H:
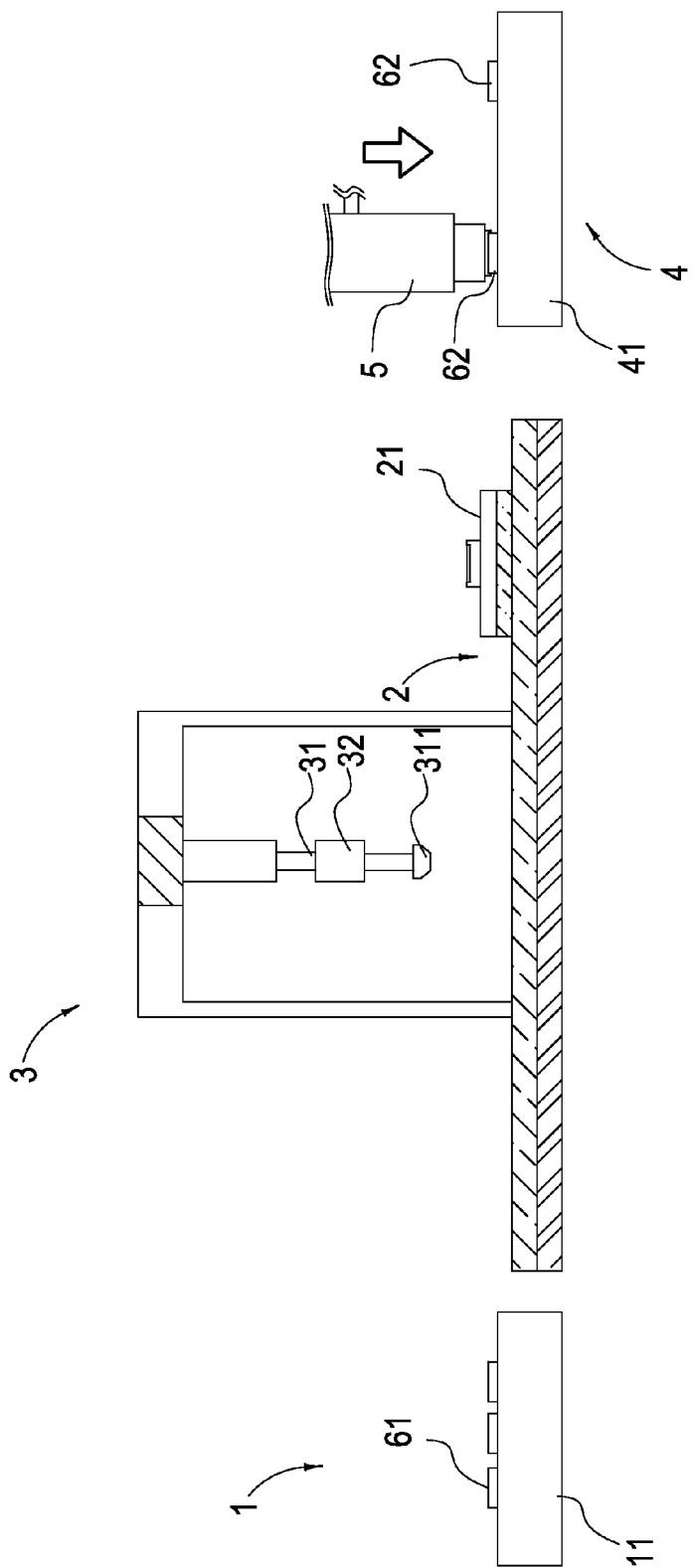

Following this, as shown in FIGS. 3E to 3F, the Z-axis test arm 31 rises up such that the tested electronic component 62 can be taken away from the test area 3 with the socket 21 of the transport device 2; finally, as shown in FIGS. 3G to 3H, the X-Y-axis pick-up arm 5 moves the tested electronic component 62 from the socket 21 of the transport device 2 to the exit area 4 and assorts it onto the carrier tray 41 in the exit area 4.

In comparison with other conventional technologies, the radiator module system for automatic test equipment according to the present invention provides the following beneficial features:

1. in the present invention, a circulating cooling device is combined with the test arm having a test head such that it is possible to allow the circulating cooling device to directly perform heat exchanges on heat energy generated by a DUT tightly stressed by downward pressure applied with the test arm so as to dissipate the generated heat energy;

2. the present invention does not require installations of additional and expensive cooling machines for heat sinking, thus further resolving issues concerning operation and maintenance processes due to line complexity caused by the conventional cooling machine;

3. through combining the closed-loop circulating cooling device onto the test arm, the present invention allows the closed-loop circulating cooling device to synchronously move in the Z-axis direction of the test arm when the test arm shifts in order to improve the conventional approach of connecting pipelines or conduits of an external cooling device thereto, thus preventing occurrence of pipeline entanglement when the test arm moves in the Z-axis direction which may lead to loose or falloff problems.

By way of the aforementioned detailed descriptions for the preferred embodiments according to the present invention, it is intended to better illustrate the characters and spirit of the present invention rather than restricting the scope of the present invention to the preferred embodiments disclosed in the previous texts. Rather, the objective is to encompass all changes and effectively equivalent arrangements within the scope of the present invention as delineated in the following claims of the present application.

What is claimed is:

1. A radiator module system for automatic test equipment, wherein the automatic test equipment comprises a closed-loop circulating cooling device and at least one test arm, with the front end of the test arm comprising a test head, wherein the closed-loop circulating cooling device is installed on the test arm and the closed-loop circulating cooling device includes:
    a cooling device;
    a set of fans;
    a conduit including an outlet and an inlet, wherein the
        conduit connected to the cooling device and internally has a working fluid, wherein the outlet and the inlet are respectively connected to the test head; and
a driving source for driving the working fluid;
wherein the closed-loop circulating cooling device drives the working fluid with the driving source thereby circulating and exchanging heat energy generated during tests by a device under test (DUT) in close contact with and stressed by the test head and thereby performing heat sinking on the cooling device with the set of fans;
wherein the test arm and the closed-loop circulating cooling device are synchronously movable in order to prevent occurrence of pipeline entanglement of the conduit when the test arm moves.

2. The radiator module system according to claim 1, wherein the conduit between the outlet and the inlet comprises at least one set of heat sinks in order to perform heat exchanges on the conduit.

3. The radiator module system according to claim 1, wherein the working fluid included in the conduit flows through the test head, the outlet, the inlet and the cooling device.

4. The radiator module system according to claim 3, wherein an internal channel is formed within the test head such that the internal channel passes through the test head, and the internal channel is connected to the inlet and the outlet of the closed-loop circulating cooling device.

5. The radiator module system according to claim 1, wherein the set of fans is installed in a parallel direction relative to the cooling device.

6. The radiator module system according to claim 1, wherein the conduit between the outlet and the cooling device is connected with the driving source.

7. A radiator module system for automatic test equipment, comprising:

an entry area, used to place a carrier tray having a plurality of devices under test (DUTs);
an exit area, used to place a carrier tray having a plurality of tested DUTs;
a set of X-Y-axis pick-up arms, used to move the DUTs between the entry area, the exit area and the test area;
a Z-axis test arm movable in a Z-axis direction, wherein a front end of the Z-axis test arm comprises a test head;
a plurality of transport devices, in which each of the transport devices comprises a test socket for insertion of the DUTs and repeatedly shuttles within the automatic test equipment; and
a closed-loop circulating cooling device installed on the test arm, wherein the closed-loop circulating cooling device includes:
a cooling device;
a set of fans;
a conduit having an outlet and an inlet, the conduit connected to a cooling device and internally including a working fluid, and wherein the outlet and the inlet are respectively connected to the test head; and
a driving source for driving the working fluid wherein the closed-loop circulating cooling device circulates and exchanges heat energy generated during tests by the DUT in close contact with and stressed by the test head and that brings up airflows by the fans to perform heat exchanges on the cooling device thereby dissipating the generated heat energy; and
wherein the Z-axis test arm and the closed-loop circulating cooling device are synchronously movable in order to prevent occurrence of pipeline entanglement of the conduit when the Z-axis test arm moves in the Z-axis direction.

* * * * *